US 6,957,965 B2

(12) United States Patent
Huang et al.

(10) Patent No.: US 6,957,965 B2
(45) Date of Patent: Oct. 25, 2005

(54) ELECTRICAL CONNECTOR ASSEMBLY WITH A TRANSFER MEMBER

(75) Inventors: Yao-Chi Huang, Tu-chen (TW); Sung-Pei Hou, Tu-chen (TW)

(73) Assignee: Hon Hai Precision Ind. Co., Ltd., Taipei Hsien (TW)

( * ) Notice: Subject to any disclaimer, the term of this patent is extended or adjusted under 35 U.S.C. 154(b) by 0 days.

(21) Appl. No.: 10/930,402

(22) Filed: Aug. 30, 2004

(65) Prior Publication Data
US 2005/0048811 A1 Mar. 3, 2005

(30) Foreign Application Priority Data
Aug. 29, 2003 (TW) ...................... 92215701 U

(51) Int. Cl.[7] .............................................. H01R 12/00
(52) U.S. Cl. ...................................... 439/70; 439/331
(58) Field of Search ............................ 439/70, 71, 330, 439/331, 525

(56) References Cited

U.S. PATENT DOCUMENTS

| 4,862,076 A | * | 8/1989 | Renner et al. ................. 439/68 |
| 5,184,285 A | | 2/1993 | Murphy et al. |
| 5,251,107 A | | 10/1993 | Takemura |
| 5,475,317 A | * | 12/1995 | Smith .......................... 439/71 |
| 5,481,435 A | | 1/1996 | Werther |
| 5,828,226 A | * | 10/1998 | Higgins et al. ............. 324/762 |
| 6,162,066 A | * | 12/2000 | Glick et al. ................... 439/73 |
| 6,383,005 B2 | * | 5/2002 | Ho et al. ..................... 439/331 |
| 6,626,682 B2 | * | 9/2003 | Sausen ......................... 439/70 |
| 6,832,918 B2 | * | 12/2004 | Hou ............................. 439/70 |

* cited by examiner

Primary Examiner—Tho D. Ta
(74) Attorney, Agent, or Firm—Wei Te Chung

(57) ABSTRACT

An electrical connector assembly includes a first connector (2), a second connector (4) and a transfer member (3). The first connector has a first housing (20) and a number of first contacts (21) received in the first housing. An Integrated Circuit chip (not shown) electrically connects with the first contacts. The second connector has a second housing (40) and a number of second contacts (41) received in the second housing. The transfer member is disposed between the first connector and the second connector. The transfer member includes a first interface (30) and a second interface (31). The first interface is formed with a number of first conductive portions (300) connecting the first contacts. The second interface provides a number of second conductive portions (301) electrically connecting the second contacts. Each first conductive portion correspondingly electrically connects one second conductive portion, and a distance between the adjacent first conductive portions is smaller than the distance between the adjacent second conductive portions.

4 Claims, 16 Drawing Sheets

ELECTRICAL CONNECTOR ASSEMBLY WITH A TRANSFER MEMBER

BACKGROUND OF THE INVENTION

1. Field of the Invention

The present invention relates to an electrical connector assembly, and particularly to an electrical connector assembly used for interconnecting an Integrated Circuit chip (hereinafter abbreviated as IC chip) and a Printed Circuit Board (hereinafter abbreviated as PCB).

2. Description of the Prior Art

As the "Test and Burn-in Socket Developments" (Connector Specifier, February 2001) discloses, a trend has been more and more clear that the IC chip is becoming minisize and an electrical connector used for interconnecting the IC chip and the PCB intends to become "light, thin and small". Such an electrical connector assembly usually comprises a mounting portion, an insulative housing and a plurality of contacts received in the insulative housing. The mounting portion fixes the insulative housing and the IC chip with the PCB thereby establishing an electrical connection between the IC chip and the PCB. Those electrical connector assemblies are described in the U.S. Pat. No. 5,481,435, No. 5,251,107 and No. 5,184,285.

Referring to FIG. 18, a conventional electrical connector assembly 9 comprises an insulative housing 90, a plurality of contacts 91 received in the insulative housing 90 and a mounting portion 92 fixed with the insulative housing 90. An IC chip (not shown) is received in the insulative housing 90 and is formed with a plurality of pins. Each pin of the IC chip connects one contact 91. The PCB 8 forms a plurality of soldering pads (not shown) corresponding to the contacts 91. Because distance between the adjacent contacts 91 is changeless, the distance between adjacent soldering pads of the PCB 8 must equal to the distance between the pins of the IC chip.

However, the IC chip is mini in size, the distance between the adjacent pins will be very small. In another hand, the soldering pads should space each other for a certain distance as a reason of anti-interference, so it will be very different for the PCB to arrange the soldering pads.

Hence, an improved electrical connector assembly is required to overcome the disadvantages of the prior art.

BRIEF SUMMARY OF THE INVENTION

An object of the present invention is to provide an improved electrical connector with a transfer member, which can solve a problem resulted by the miniaturization of the IC chip.

An electrical connector in accordance with the present invention comprises a first connector, a second connector and a transfer member interconnecting the first connector and the second connector. The first connector includes a first housing and a plurality of first contacts received in the first housing. The second connector has a second housing and a plurality of second contacts received in the second housing. The transfer member disposes between the first connector and the second connector and comprises a first interface and a second interface. The first interface defines a plurality of first receiving holes receiving the first contacts therein. The second interface forms a plurality of golden fingers electrically connecting the second contacts. Each first receiving hole correspondingly electrically connects one golden finger, and a distance between the adjacent first receiving holes is smaller than the distance between the adjacent golden fingers.

To compare with the conventional invention, the merit of the present invention is the transfer member. The first connector connects an IC chip, and the distance between adjacent pins of the IC chip equals to the distance between the adjacent first contacts. Because of the minisize of the IC chip, this distance is very small. In another hand, the distance between the adjacent second contacts of the second connector is the same as the distance of adjacent soldering portions of the PCB. As a requirement of anti-interference, this distance should be wider than the distance between the adjacent first contacts. Because the distance between the adjacent golden fingers formed on the second interface is wider than the distance between the adjacent first receiving holes defined on the first interface, the IC chip with a narrow distance between the adjacent pins may be connected to the PCB.

Other objects, advantages and novel features of the invention will become more apparent from the following detailed description of a preferred embodiment when taken in conjunction with the accompanying drawings.

DETAILED DESCRIPTION OF THE PREFERRED EMBODIMENTS

Figure 1:
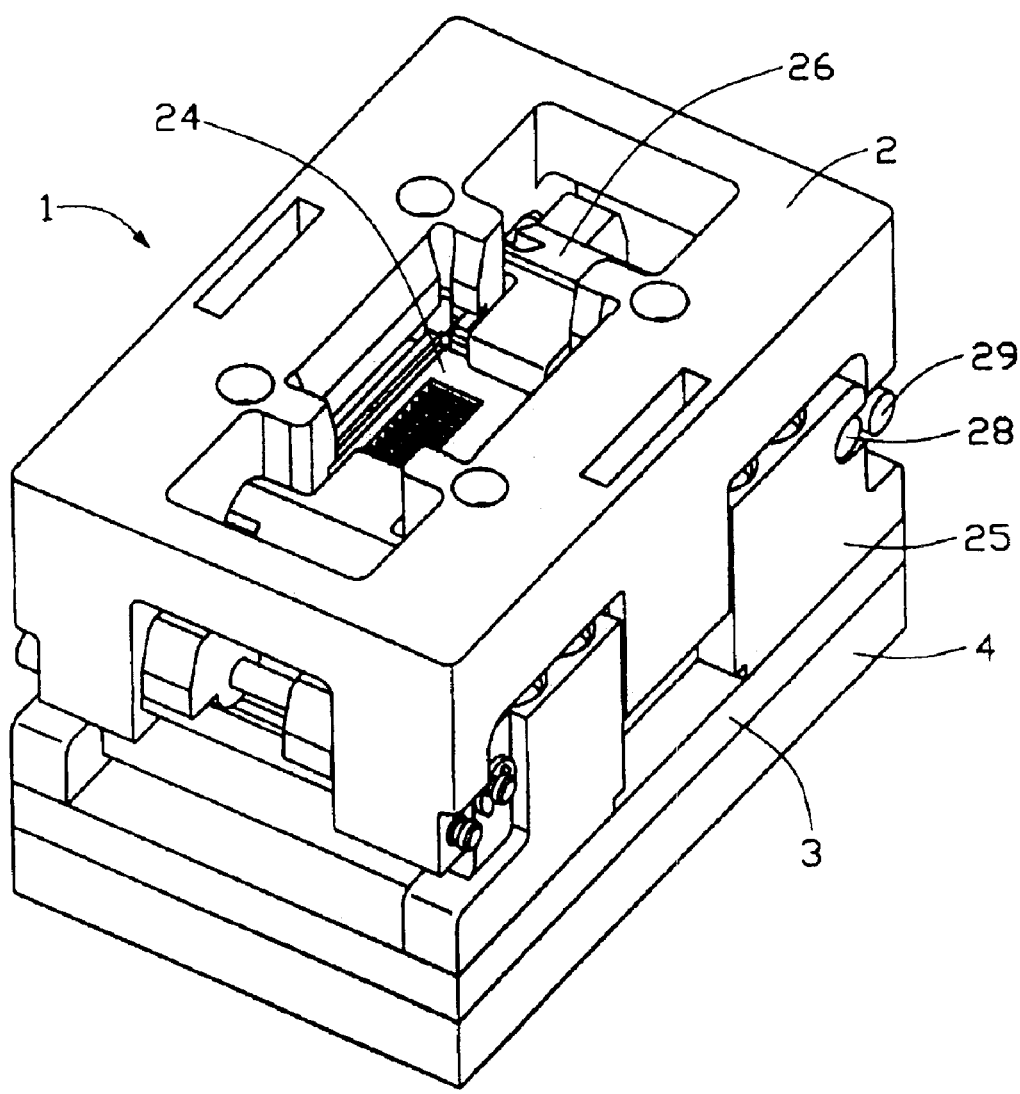
FIG. 1 is an assembled view of an electrical connector assembly in accordance with the present invention.

Referring to FIGS. 1, 13, 14, 15 and 17, an electrical connector assembly 1 used for interconnecting an IC chip (not shown) and a PCB (not shown), comprises a first connector 2, a second connector 4 and a transfer member 3 interconnecting the first connector 2 and the second connector 3. The first connector 2 comprises a first housing 20, a plurality of first contacts 21 received in the first housing 20, a first assembly member 22, a second assembly member 23, a third assembly member 24, a fourth assembly member 25, a fifth assembly member 27 and a locking member 26. The second connector 4 comprises a second housing 40 and a plurality of second contacts 41. The transfer member 3 defines a first interface 30 and a second interface 31. The first interface 30 engages with the first connector 2. The second interface 31 is defined opposite to the first interface 30 and engages with the second connector 4. The transfer member 3 has a plurality of receiving holes 300 defining through the first interface 30 and the second interface 31 corresponding to the contact 21. The second interface 31 is formed with a plurality of golden fingers 310 arranged in two rows in longitudinal direction. Each receiving hole 300 connects one golden finger 310 with a wire (not labeled).

Figure 2:
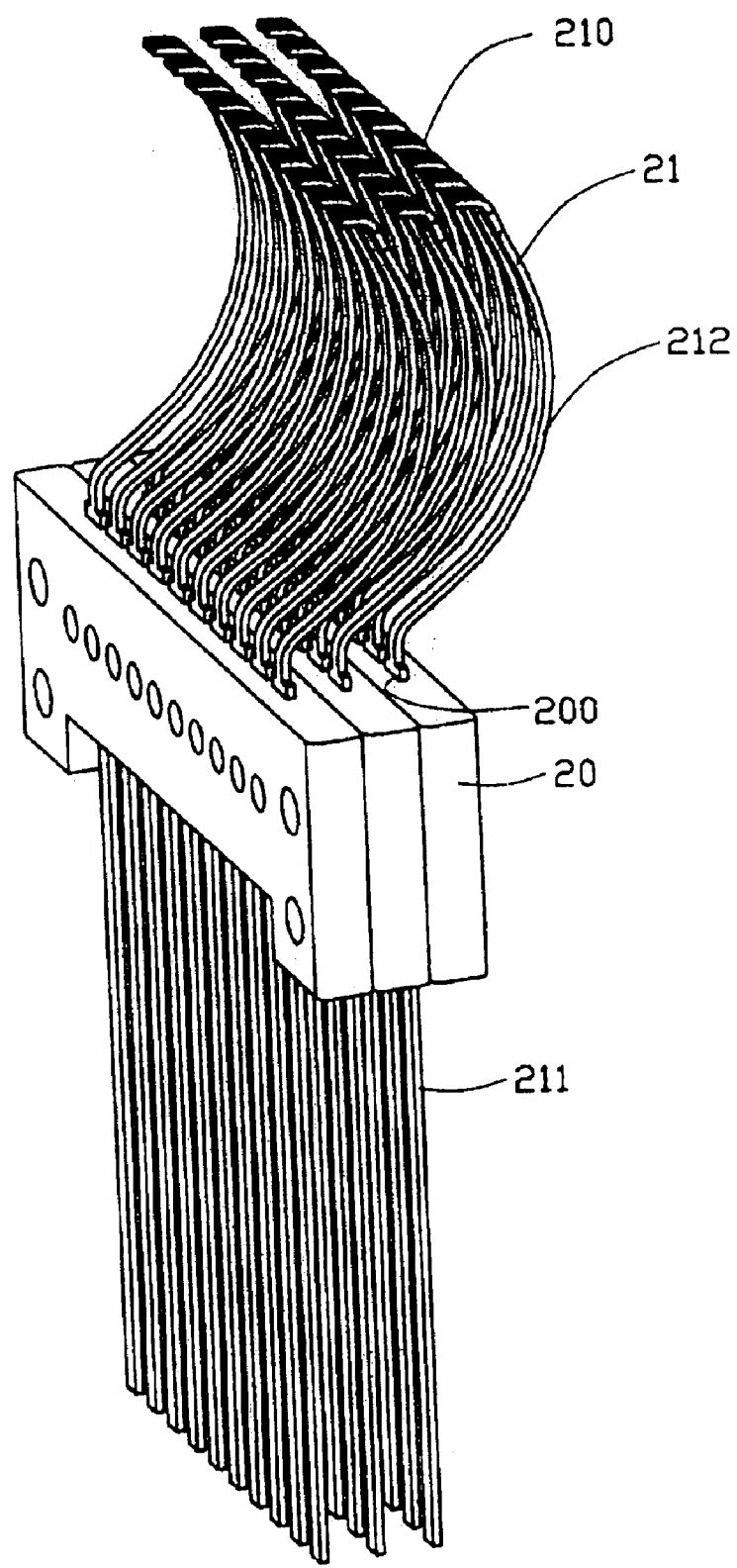
FIG. 2 is an assembled view of a first contact and a first housing of a first connector.
Figure 3:
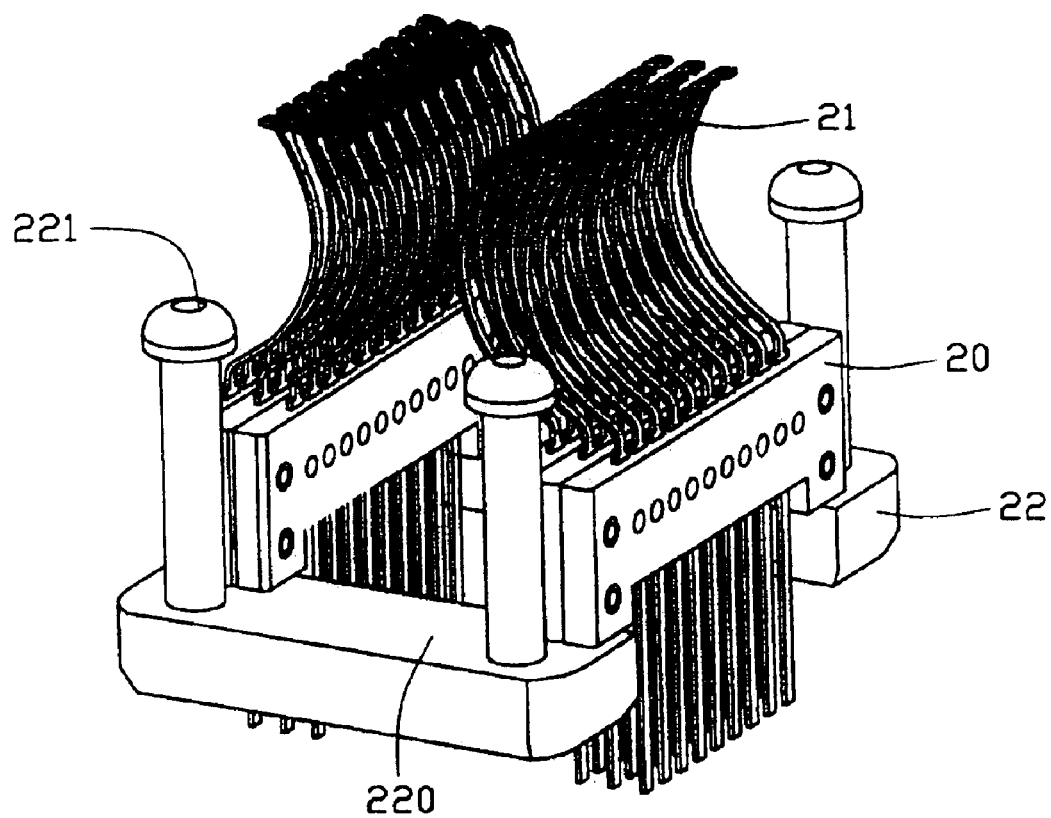
FIG. 3 is an assembled view of a first assembly member, the first contact and the first housing of the first connector.

Referring to FIGS. 2 and 3, the first housing 20 of the first connector 2 is formed with a lengthwise configuration, and defines a plurality of slits 200. Each of the slits 200 receives one contact 21 therein. The contact 21 comprises a first contacting portion 210 for contacting a pin of the IC chip, a first soldering portion 211 soldering with the receiving hole 300, and a first connecting portion 212 interconnecting the first contacting portion 210 and the first soldering portion 211. The first assembly member 22 comprises a base 220 and a pair of first positioning post 221 symmetrically projecting from the base 220. In assembly, a pair of first assembly members 22 is placed parallelly with each other. The first housing 20 mounts on the bases 220 and interconnects two first positioning posts 221 of different first assembly member 22.

Figure 4:
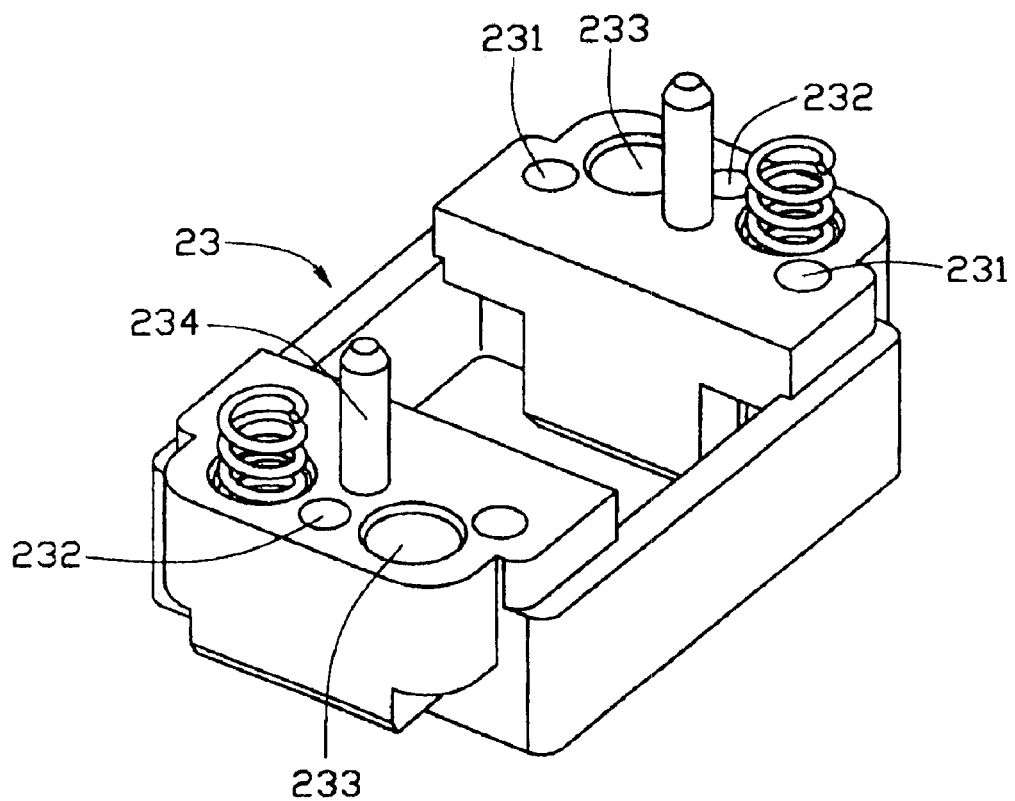
FIG. 4 is a perspective view of a second assembly member of the first connector.
Figure 5:
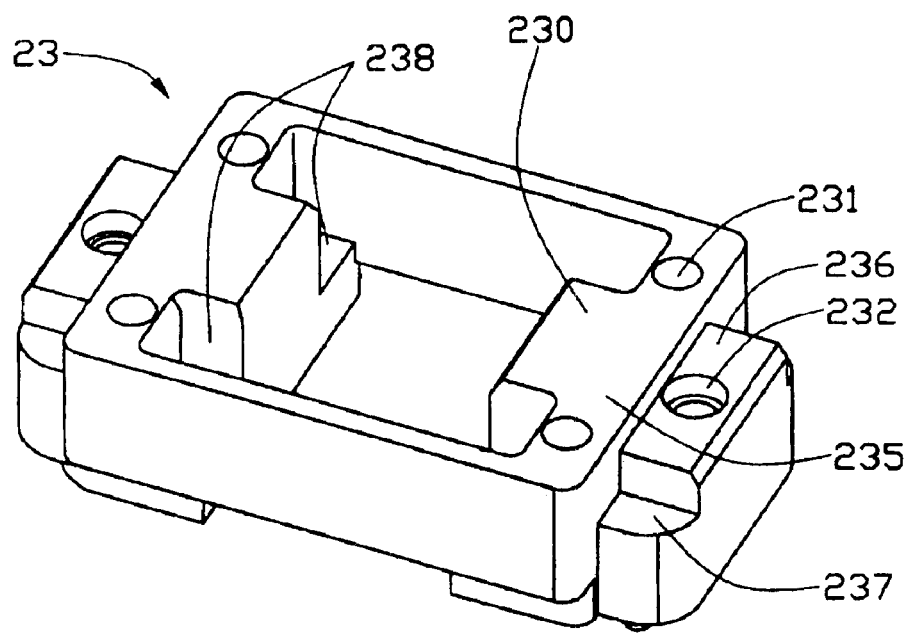
FIG. 5 is another perspective view of the second assembly member showing a bottom surface.
Figure 6:
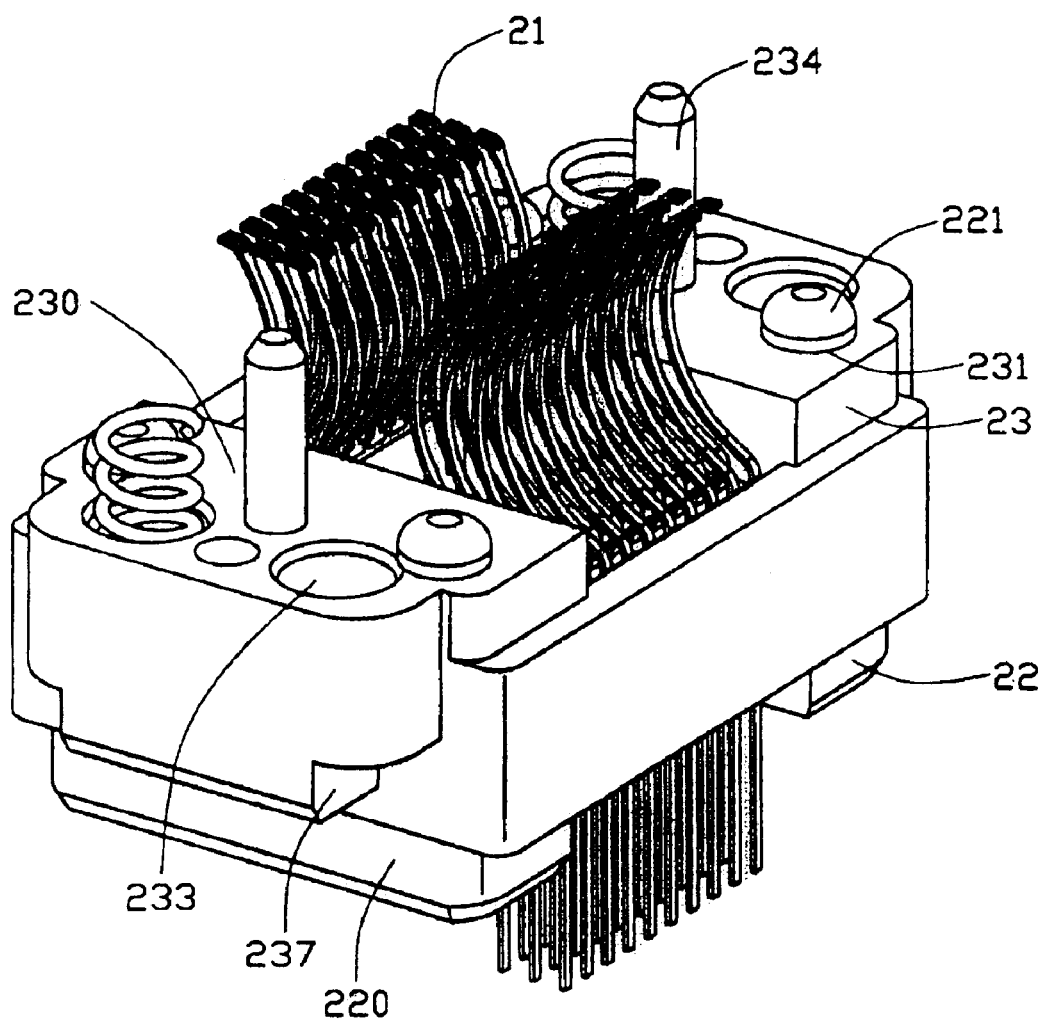
FIG. 6 is an assembled view of the first contact, the first housing, the first assembly member and the second assembly member.

Referring to FIGS. 4, 5 and 6, the second assembly member 23 substantially is a frame. A pair of positioning portions 230 is formed at ends of the second assembly member 23 in a longitudinal direction. Two pairs of first positioning bores 231 and third positioning bores 233 are symmetrically defined on the positioning portions 230. A pair of second positioning bores 232 is defined through the positioning portion 230, and a pair of positioning posts 234 is vertically projecting upwardly from positioning portion 230. A pair of the diagonal third positioning bores 233 each receives a spring (not labeled). The positioning portion 230 comprises a first abutting wall 235 abutting the first assembly member 22 and a lower second abutting wall 236. A pair of first recessing portions 238 is defined at the opposite edges of the first abutting wall 235. A pair of second recessing portions 237 is defined at the opposite edges of the second abutting wall 236. In assembly, the second assembly member 23 engages with the first housing 20, first contact 21 and the first assembly member 22. A pair of first recessing portions 238 of different positioning portions 230 engages with first housing 20. The first abutting walls 235 abut against the bases 220, and each of the first positioning posts 221 engages with one first positioning bore 231.

Figure 7:
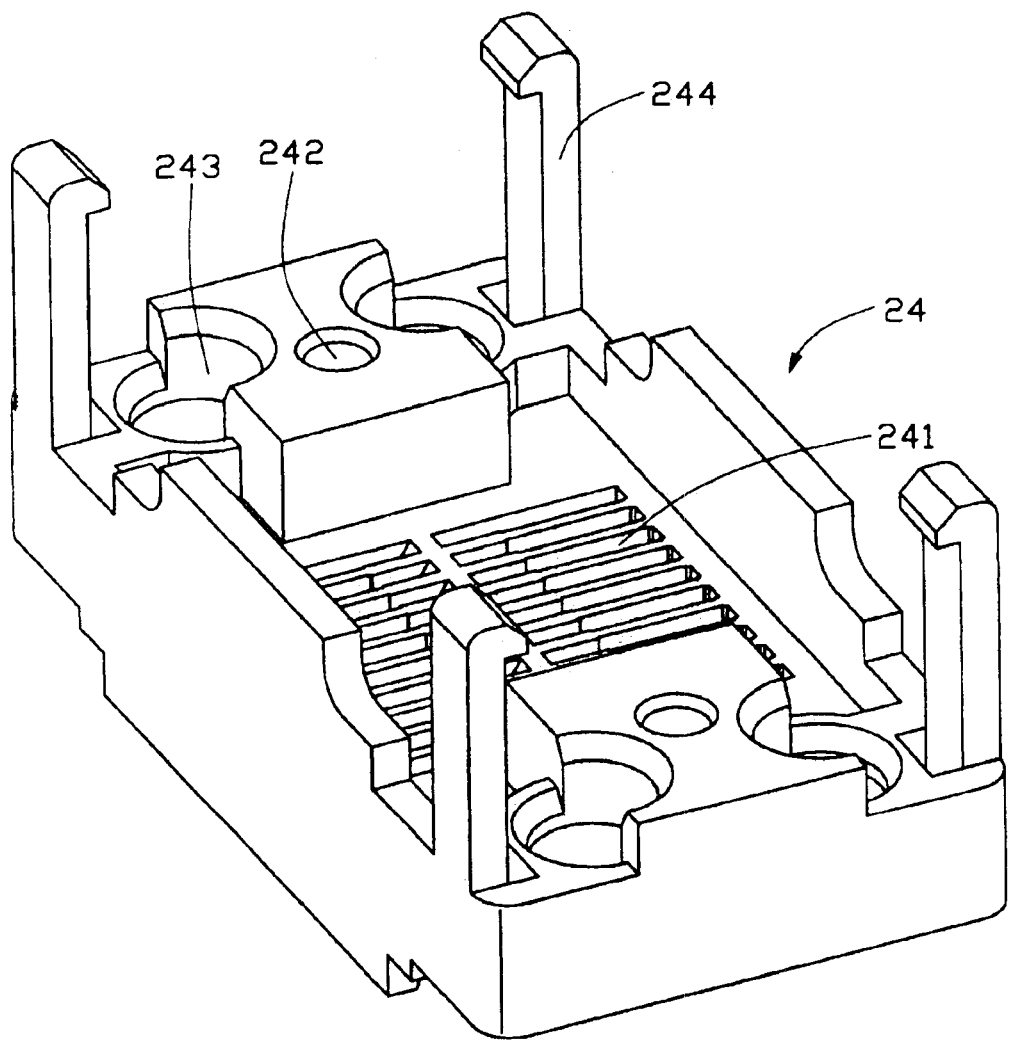
FIG. 7 is a perspective view of a third assembly member of the first connector.
Figure 8:
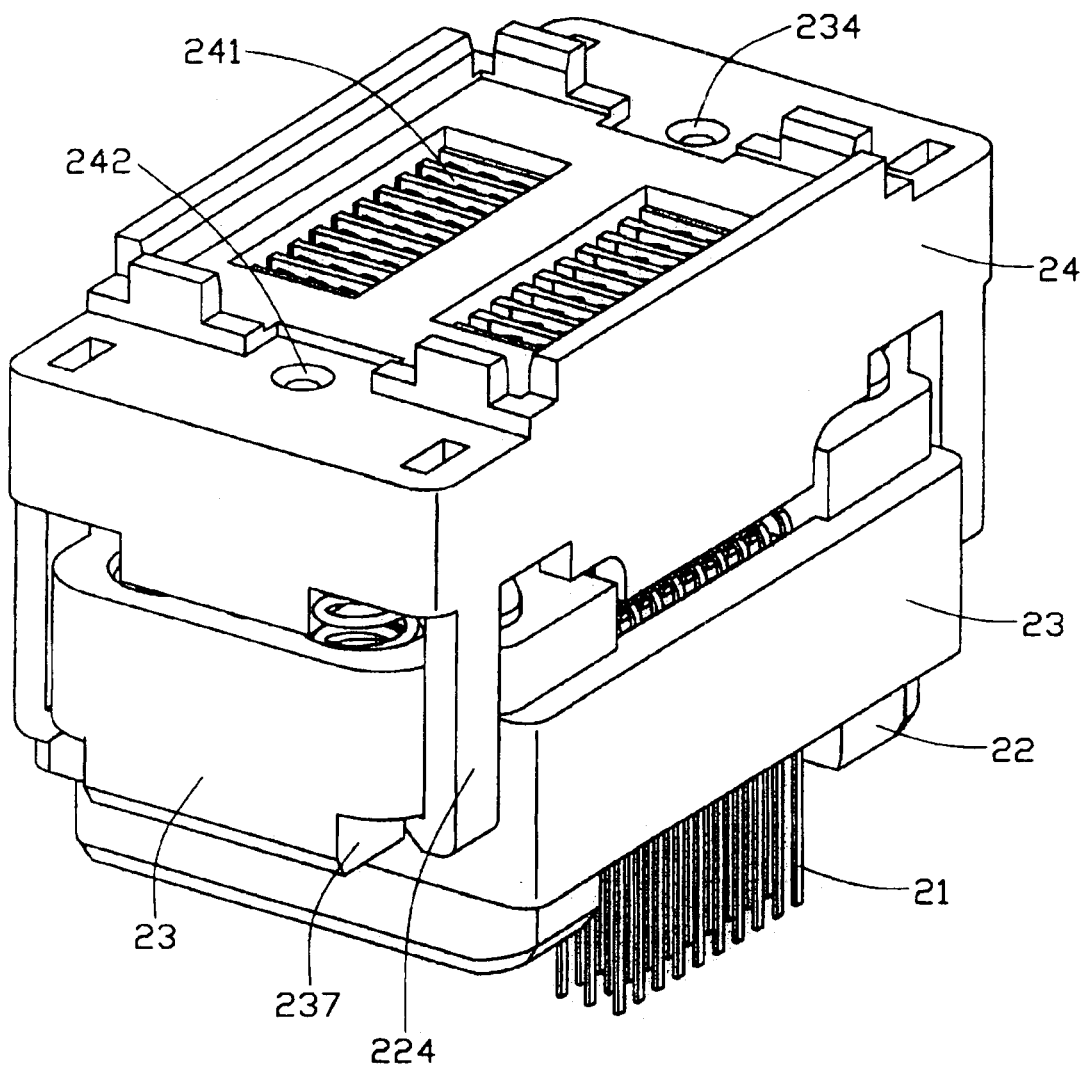
FIG. 8 is an assembled view of the first contact, the first housing, the first assembly member, the second assembly member and the third assembly member.

Referring to FIGS. 7 and 8, the third assembly member 24 is formed with a plurality of grooves 241 arranged in two rows in a longitudinal direction. A pair of first engaging bore 242 is defined on the third assembly member 24 according to the second positioning posts 234. Four clasping arms 244 project downwardly at corner portions of a lower surface of the third assembly member 24. Two pairs of second engaging bores 243 are defined at the lower surface of the third assembly member 24 corresponding to the third positioning bores 233 of the second assembly member 23. In assembly, the third assembly member 24 engages with an assembled member shown in FIG. 6. The third assembly member 24 mounts on the second assembly member 23, and the grooves 241 each receive one first contact 21 therein. The first engaging bores 242 engage with the second positioning posts 234, thus the four second engaging bores 243 are opened against the third positioning bore 233. Two of the second engaging bores 243 corresponding the diagonal third positioning bores 233 receives free end of the springs. The four clasping arms 244 engage with the second recessing portions 237 of the second assembly member 23 and clasp the third assembly member 24 with the second assembly member 23, thus the third assembly member 24 is capable of moving downwardly towards the second assembly member 23.

Figure 9:
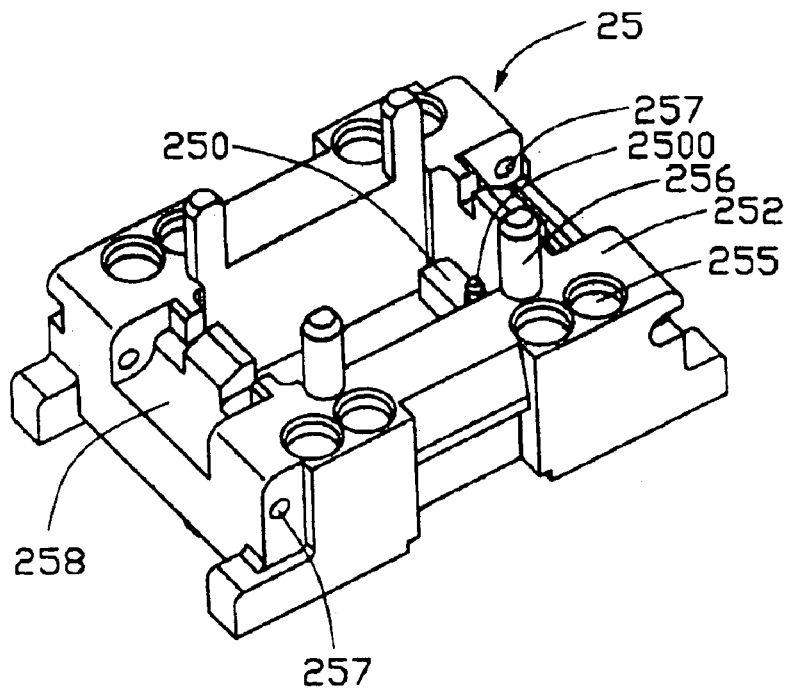
FIG. 9 is a perspective view of a fourth assembly member of the first connector.
Figure 10:
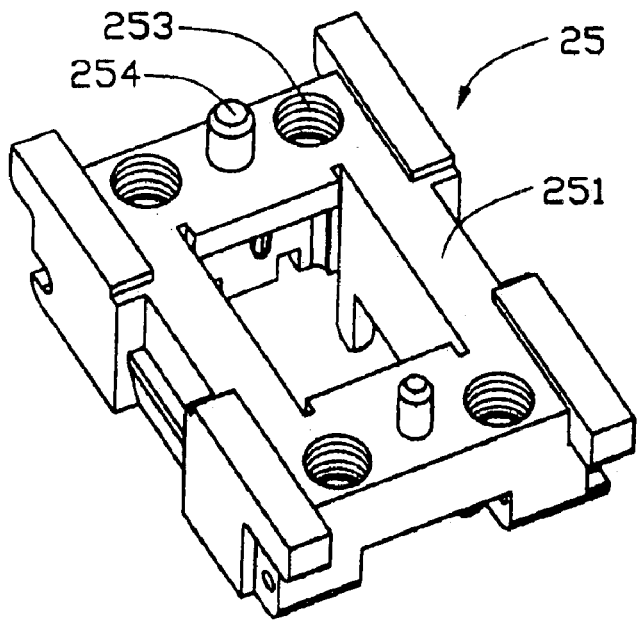
FIG. 10 is another perspective view of the fourth assembly member showing a bottom surface.
Figure 11:
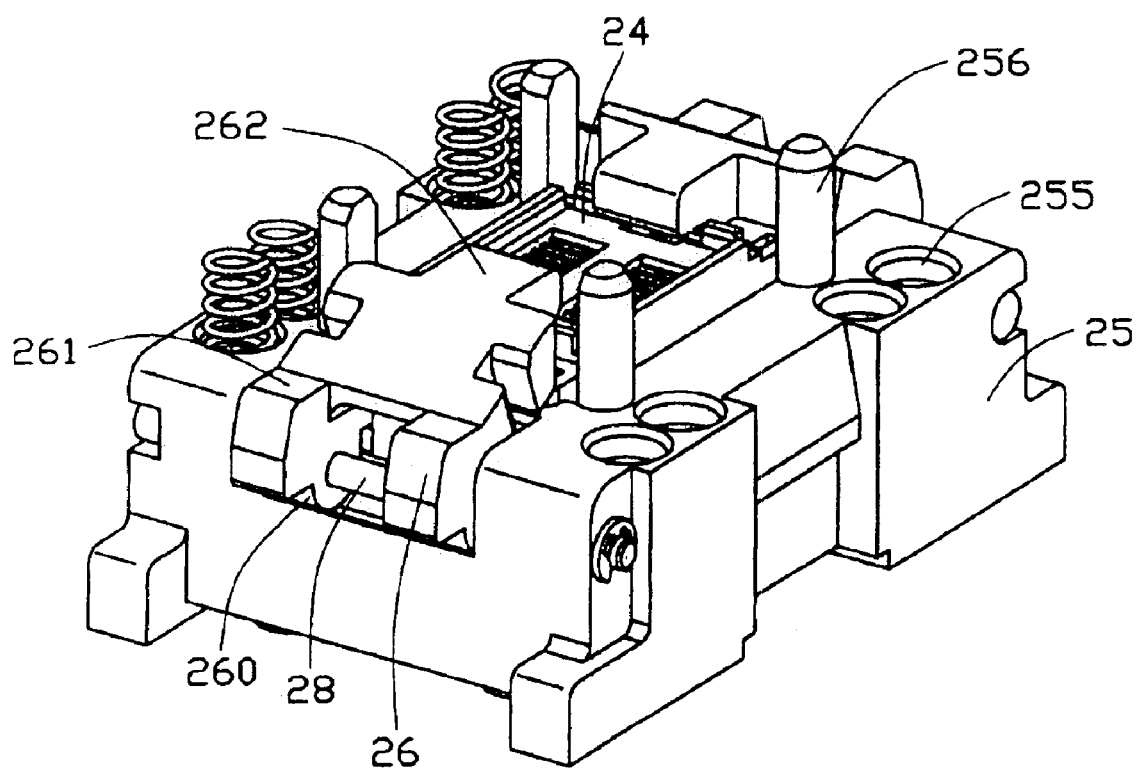
FIG. 11 is an assembly view of the first contact, the first housing, the first assembly member, the second assembly member, the third assembly member, the fourth assembly member and a locking member of the first connector.

Referring to FIGS. 9, 10 and 11, the fourth assembly member 25 or the first connector 2 also has a frame configuration and defines a cavity(not labeled). A pair of supporting portions 250 respectively extends towards each other from a bottom portion of an inner sidewall of the fourth assembly member 25. A pair of third positioning posts 2500 respectively vertically project from middle portions of the supporting portions 250. A first engaging wall 251 is defined adjacent to the transfer member 3 at a lower surface of the fourth assembly member 25. A second engaging wall 252 is defined opposite to the first engaging wall 251 at an upper surface of the fourth assembly member 25. A plurality of first receiving holes 253 is defined at corner portions of the first engaging wall 251. A pair of first engaging posts 254 symmetrically and downwardly projects from the first engaging wall 251 in a longitudinal direction. Every two second receiving holes 255 are defined at a corner portion of the second engaging wall 252, and a second engaging post 256 upwardly projects from each corner portion. The fourth assembly member 25 also defines a pair third recessing portions 258 at longitudinal ends thereof. A pair of third receiving holes 257 is defined at opposite inner walls of each third recessing portion 258. The locking members 26 have configurations of mirror imaged Z shape, and engage with the fourth assembly member 25. A lower end 261 of the mirror imaged Z-shaped locking member 26 engages the third receiving portion 257. The locking member 26 defines a pair of fourth receiving holes (not labeled) corresponding to the third receiving holes 257 and a fourth recessing portion 260 at a free end of the lower end 261. A first bolt 28 passes through the third receiving holes 257 and the fourth receiving holes thereby securing the locking member 26 with the fourth assembly member 25. In assembly, the assembled member in FIG. 8 is inserted into the cavity of fourth assembly member 25 in an up-to-down direction, of which the second abutting wall 236 abuts the supporting portion 250, and the third positioning posts 2500 respectively couple with the second positioning bore 232. A higher end 262 of the locking member 26 abuts a top surface of the third assembly member 24. A plurality of springs is received in the second receiving hole 255.

Figure 12:
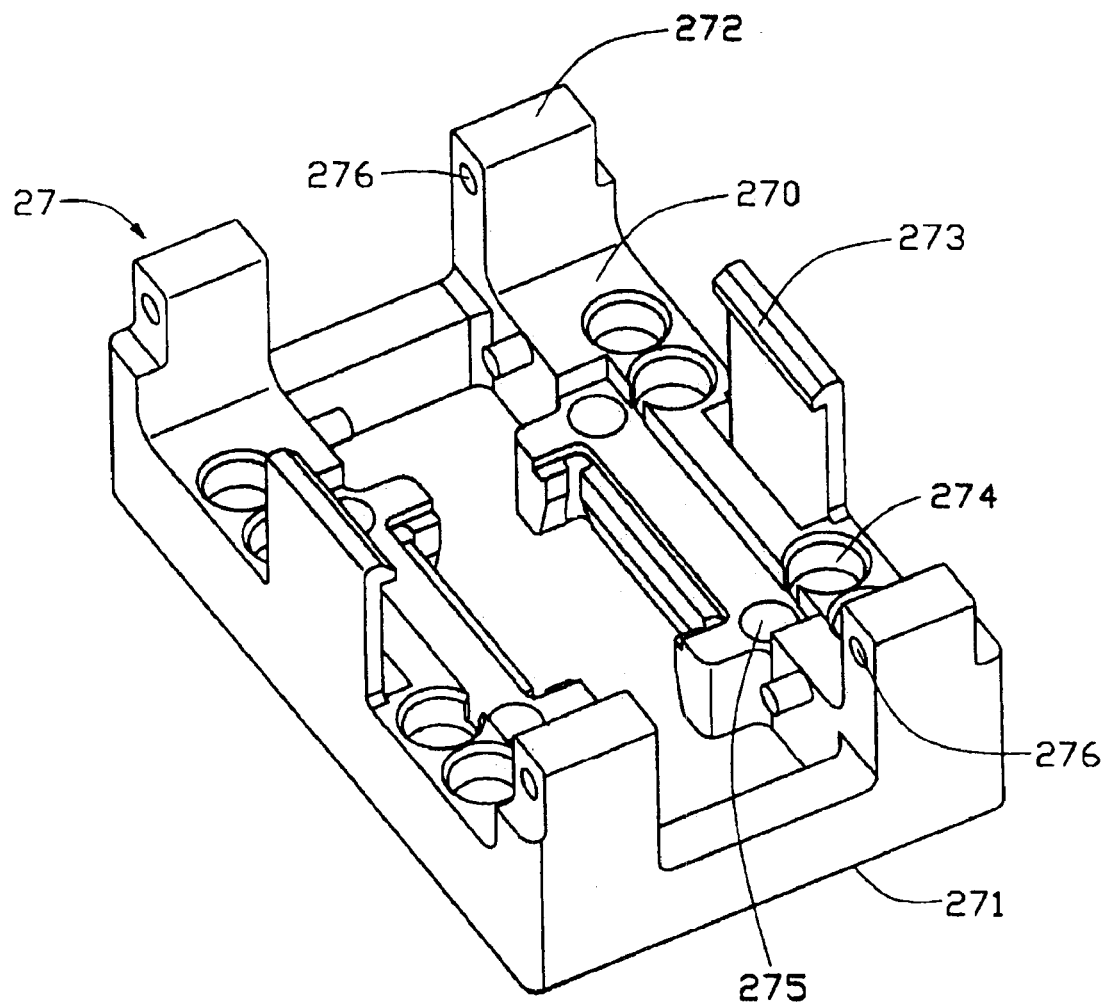
FIG. 12 is a perspective view of a fifth assembly member of the first connector.
Figure 13:
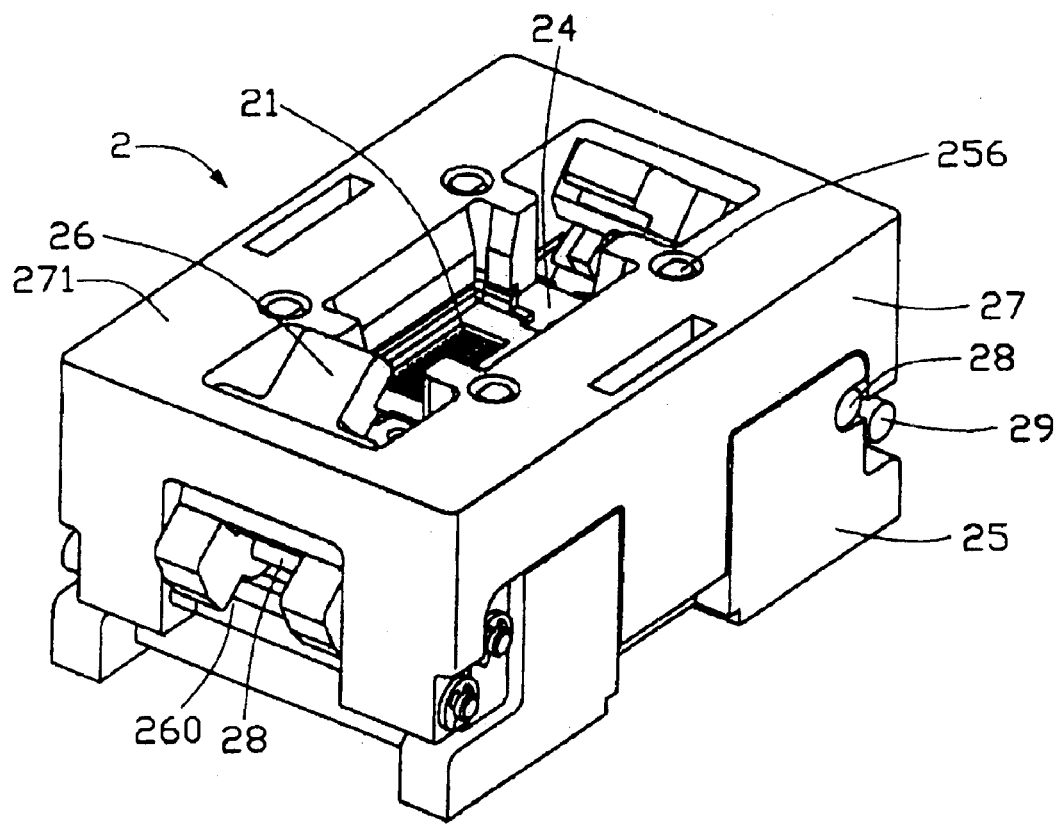
FIG. 13 is an assembled view of the first connector.

Referring to FIGS. 12 and 13, the fifth assembly member 27 comprises a third engaging wall 270 defined at a lower surface and a fourth engaging wall defined at a top surface thereof. Four first coupling arms 272 vertically and downwardly project from corner portions of the third engaging wall 270. A pair of first tabs 273 respectively extends downwardly from a middle portion of longitudinal side edges of the third engaging wall 270. A plurality of third receiving holes 274 is defined on the third engaging wall 270 corresponding to the second receiving holes 255 of the fourth assembly member 25. Four fourth positioning bores 275 are defined through the third engaging wall 270 corresponding to the second engaging posts 256. Each first coupling arm 272 defines a first coupling hole 276 therethrough at a latitudinal direction. In assembly, the third receiving hole 274 corresponds to the second receiving hole 255 and receives free ends of spring therein. The fourth positioning bore 275 couple with the second engaging post 256. The first coupling arms 272 abuts the latitudinal sidewall of the fourth assembly member 25. Because of the springs received in the second receiving holes 255 and the third receiving holes 274, the fifth assembly member 27 is capable of pressed down towards the fourth assembly member 25. When an external force is exerted on the fifth assembly member 27, the spring is caused to distort, the fifth assembly member 27 is pressed on the fourth assembly member 25. A second bolt 29 is inserted through each pair of first coupling holes 276, and is mounted below the lower ends 261 and is received in the fourth recessing portion 260 of the locking member 26. When the external force is removed, the fifth assembly member 27 restores itself under a restore force of the springs. In a restore operation, as the second bolts 29 couple with first coupling arms 272 and the fourth recessing portions 260, the second bolt 29 is taken along by the fifth assembly member 27 and causes the lower end 261 been raised. Because the locking member 26 couples with the first bolt 28 and is able to pivot around the first bolt 28, as a principle of leverage, the higher end 262 moves downwardly and presses third assembly member 24.

Figure 14:
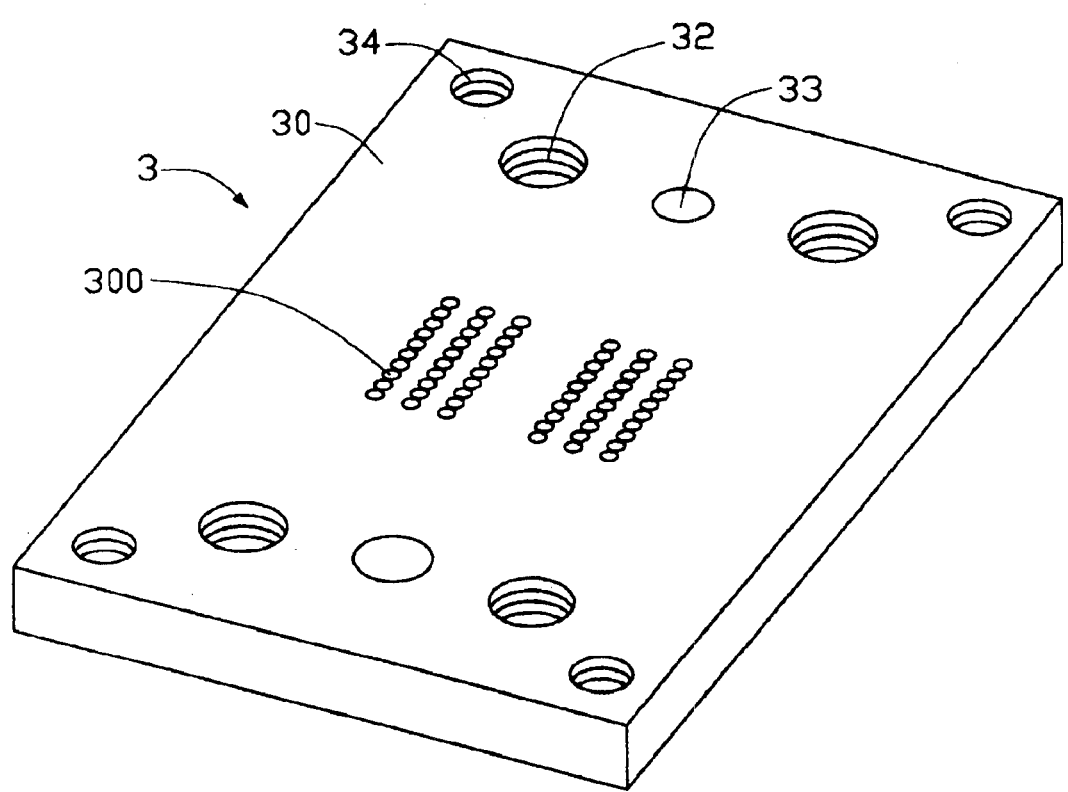
FIG. 14 is a perspective view of a transfer member showing a first interface of the electrical connector assembly.
Figure 15:
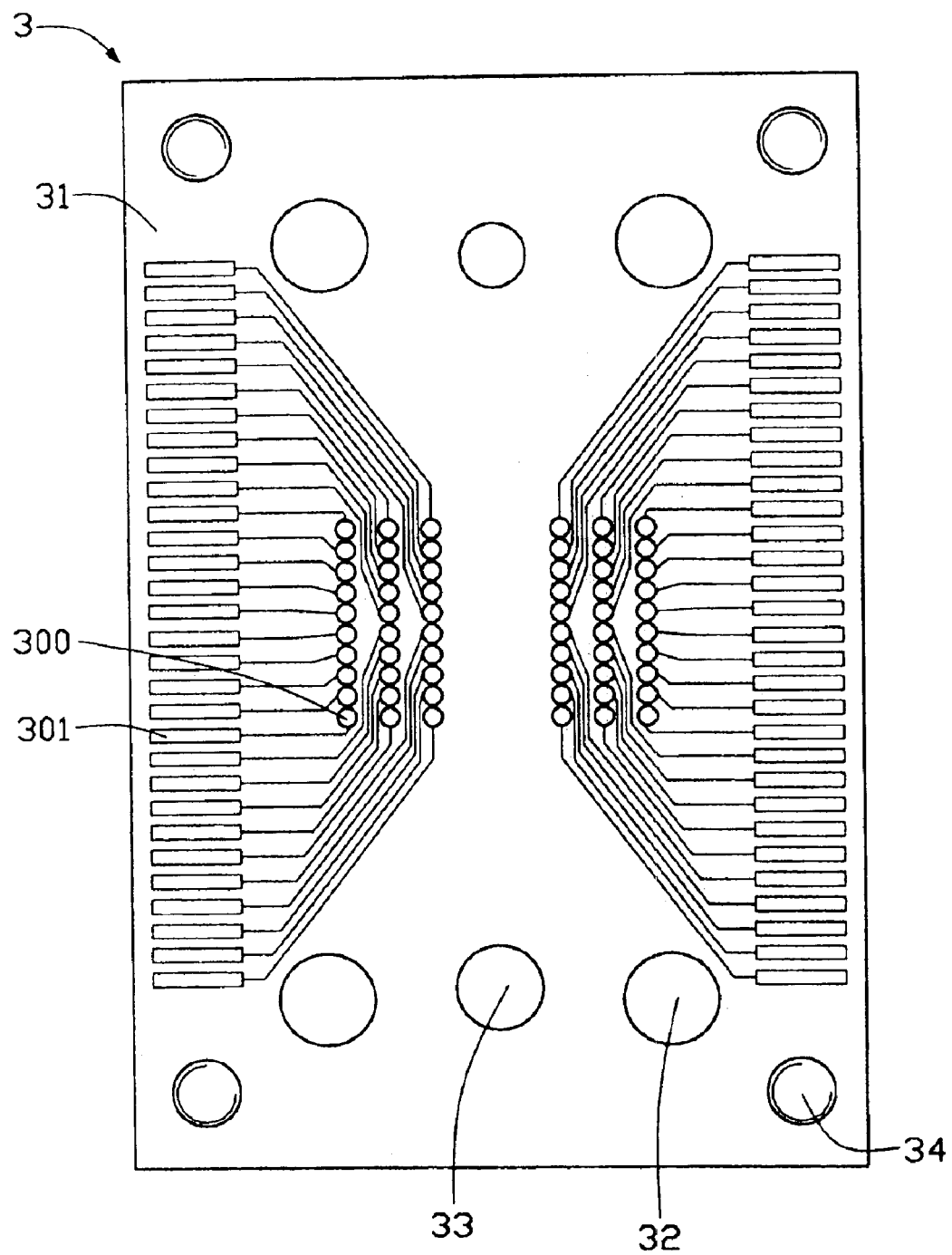
FIG. 15 is another perspective view of the transfer member showing a second interface.
Figure 16:
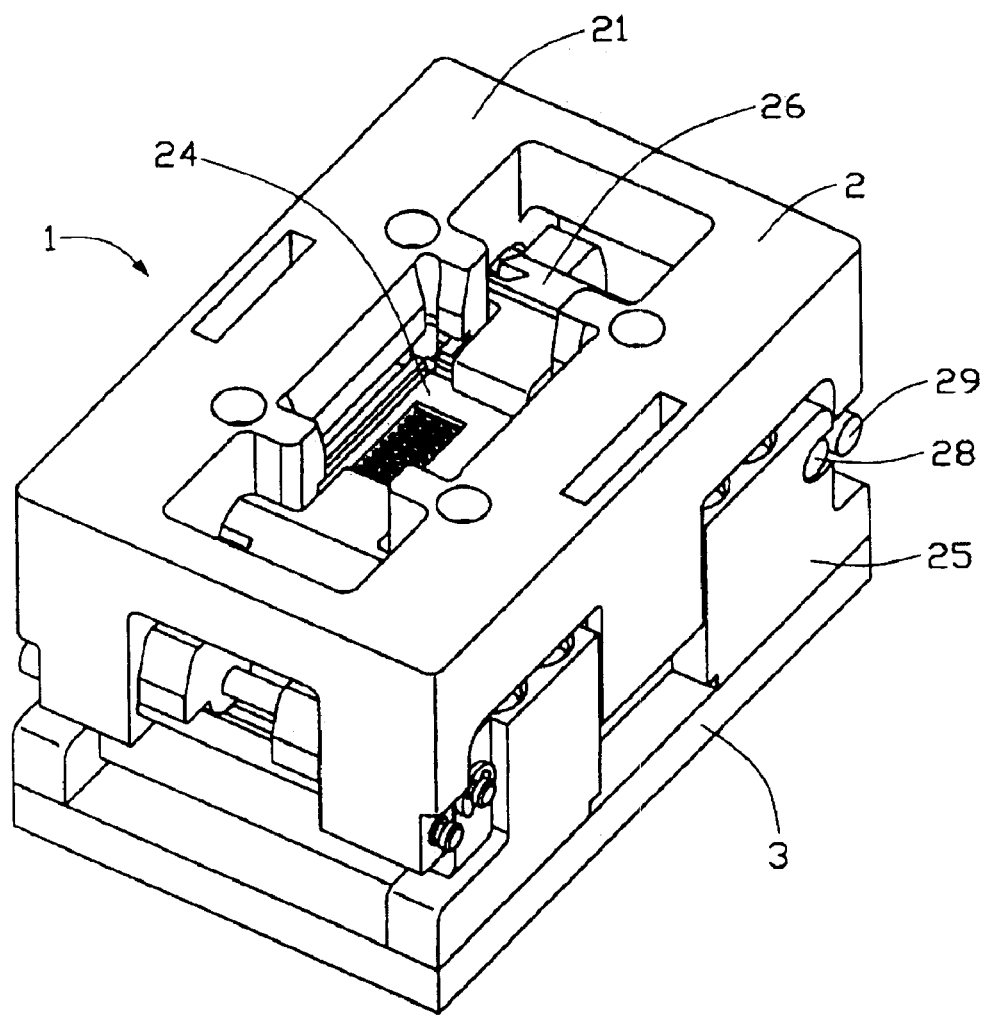
FIG. 16 is an assembled view of the first connector and the transfer member.

Referring to FIGS. 14, 15 and 16, the transfer member 3 is a plan plate with a circuit. The transfer member 3 comprises a first interface 30 connecting with the first connector 2 and a second interface 31 connecting with the second connector 3. A plurality of first conductive holes 300 is defined through the transfer member 3 corresponding the first soldering portions 211. A plurality of golden fingers 301 is arranged in two rows in longitudinal direction, each golden finger 301 electrically connects a conductive holes 300. A distance between adjacent golden fingers 301 is twice widths of the distance between the adjacent conductive holes 300. A plurality of first engaging holes 32 is defined corresponding to the first receiving holes 253, and a pair of second engaging holes 33 is defined corresponding to the first engaging post 254. Four first positioning holes 34 are defined at corner portions of the transfer member 3. In assembly, the first engaging posts 254 couples with the second engaging holes 33. The first contacts 21 are respectively received in the corresponding conductive holes 300, and solder with the conductive holes 300. A plurality of screws is used to couple the first engaging holes 32 with the first receiving holes 253.

Figure 17:
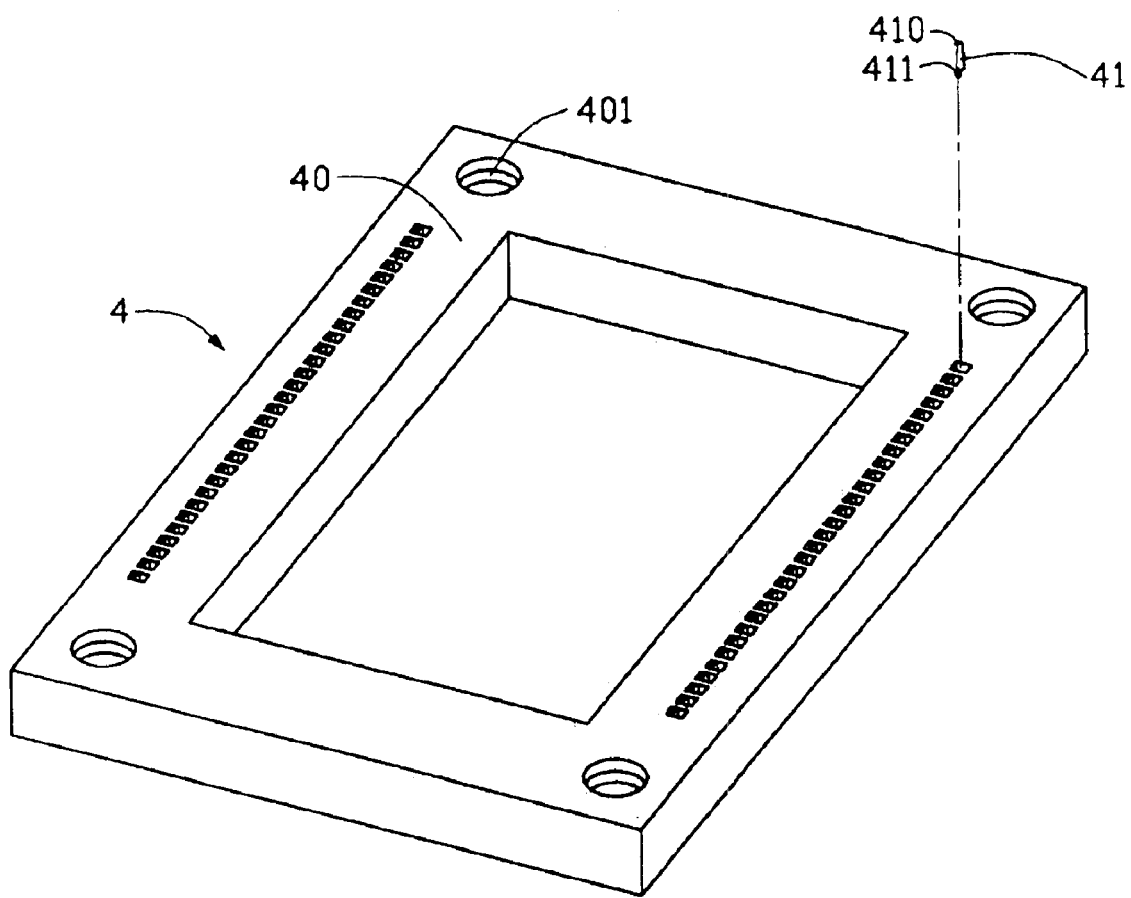
FIG. 17 is a perspective view of a second connector of the electrical connector assembly.
Figure 18:
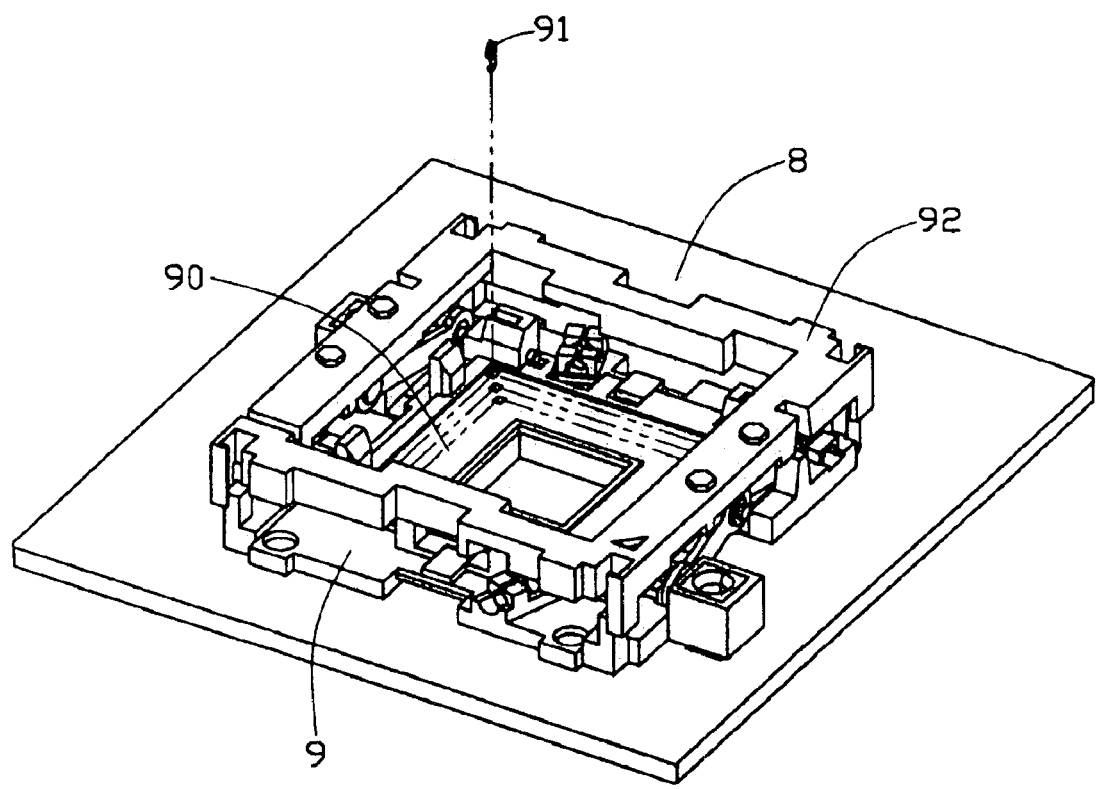
FIG. 18 is an assembled view of a conventional electrical connector assembly.

Referring to FIG. 17, the second connector 4 is a flat frame. The second connector 4 comprises a second housing 40 and a plurality of second contacts 41 received in the second housing 40. The second contacts are arranged in two rows in a longitudinal direction corresponding to the golden fingers 301. Each second contact 41 comprises a second contacting portion 410 at an upper portion and a second soldering portion at a lower portion 411. Four second positioning holes 401 are defined corresponding to the first positioning holes 34 of the transfer member 3. In assembly, the transfer member 3 secures with the second connector 4 by bolting the first positioning hole 34 with the second positioning hole 401.

When the IC chip (not labeled) is put in, the steps are given out hereinbelow. First, an external force is exerted on the higher ends 262 of locking member 26 to raise it, as a principle of leverage, the lower ends 261 are caused to move down thereby pressing the second bolts 29 and causing the fifth assembly member 27 moving down. Because of the first bolt 28, the higher ends 262 respectively pivot around the corresponding first bolts 28, and the third assembly member is exposed upwardly. Thus, the IC chip is easily to put in.

After the IC chip is put in, the external force is removed. As a restore force of the springs received in the second receiving holes 255 and third receiving holes 274, the fifth assembly member 27 restore to a normal status. With a pressure of the second bolt 29, the lower ends 261 pivot around the first bolt 28 and the higher ends 262 are caused to press the IC chip. Mentioned hereinabove, there are springs received in the third positioning bores 233 and second engaging bores 243. These springs are pressed to distort and the third assembly member 24 is lowed. So, the first contacting portions 210 of the first contacts 21 expose from the grooves 241 of the third assembly member 24 and electrically connect with IC chip thereby connecting with a PCB through the transfer member 3 and the second contacts 41.

It will be understood that the invention may be embodied in other specific forms without departing from the spirit or central characteristics thereof. The present examples and embodiments, therefore, are to be considered in all respects as illustrative and not restrictive, and the invention is not be limited to the details given herein.

We claim:

1. An electrical connector assembly for electrically interconnecting an Integrated Circuit chip (IC chip) and an electrical element, comprising:

a first assembly member;

a second assembly member attached to the first assembly member;

a third assembly member attached to the combined first and second assembly members with a first biasing member to provide resiliency therebetween in a first direction;

a fourth assembly member attached to the combined first, second and third assembly members; and a fifth assembly member attached to the combined first, second, third and fourth assembly members with a second biasing member to provide resiliency therebetween in said first direction; wherein a locking member is pivotally mounted to the combined first, second, third and fourth assembly members;

a transfer member attached to the fifth assembly member, a first connector attached to the first assembly member, said first connector having a first housing and a plurality of first contacts received in the first housing;

a second connector attached to the transfer member, said second connector having a second housing and a plurality of second contacts received in the second housing;

said transfer member disposed between the first connector and the second connector and comprising a first interface and a second interface, the first interface defining a plurality of first conductive portions connecting the first contacts, the second interface providing a plurality of second conductive portions electrically connecting the second contacts, each first conductive portion correspondingly electrically connecting one second conductive portion, and a distance between adjacent first conductive portions being smaller than the distance between adjacent second conductive portions.

2. The electrically connector assembly as claimed in claim 1, wherein the distance between adjacent conducting portions of the IC chip is the same as the distance between the adjacent first contacts, the distance between the adjacent first contacts is the same as the distance between the first conductive portions of the transfer member.

3. The electrically connector assembly as claimed in claim 1, wherein the distance between the second conductive portions is the same as the distance between the adjacent second contacts.

4. The electrically connector assembly as claimed in claim 1, wherein the distance between the adjacent first conductive portions of the transfer member is the half of the distance between the adjacent second conductive portions.

* * * * *